United States Patent [19]

Przybysz et al.

[11] Patent Number: 4,983,971

[45] Date of Patent: Jan. 8, 1991

[54] JOSEPHSON ANALOG TO DIGITAL CONVERTER FOR LOW-LEVEL SIGNALS

[75] Inventors: John X. Przybysz, Penn Hills, Pa.; Clark A. Hamilton, Boulder, Colo.

[73] Assignee: Westinghouse Electric Corp., Pittsburgh, Pa.

[21] Appl. No.: 372,990

[22] Filed: Jun. 29, 1989

[51] Int. Cl.$^5$ .............................................. H03M 1/12
[52] U.S. Cl. .................................... 341/133; 341/155; 307/277; 505/864
[58] Field of Search ................ 341/133, 122, 155, 157, 341/171; 357/5; 307/277, 306; 505/864

[56] References Cited

U.S. PATENT DOCUMENTS

| | | |
|---|---|---|
| 3,816,845 | 6/1976 | Cuomo et al. |
| 3,983,419 | 9/1976 | Fang .................................... 307/277 |
| 4,202,959 | 9/1980 | Kroger |
| 4,242,419 | 12/1980 | Dayem et al. |
| 4,315,255 | 2/1982 | Harris et al. |
| 4,432,134 | 2/1984 | Jones et al. |
| 4,496,854 | 1/1985 | Chi |
| 4,551,704 | 11/1985 | Anderson ............................ 341/122 |
| 4,646,060 | 2/1987 | Phillips et al. |
| 4,672,359 | 6/1987 | Silver |
| 4,856,099 | 8/1989 | Stebbins ............................ 341/133 |

OTHER PUBLICATIONS

Hamilton et al., "100 GHz Binary Counter Based on DC SQUID" IEEE Electron Device Letters, vol. EDL-3, No. 11, pp. 335–338, Nov. 1982.

Ketchen, (Paper on DC SQUID) IEEE Trans. on Magnetics, vol. MAG-17, No. 1, Jan. 1981, pp. 387–394.

Nakagawa et al. "A Josephson Counter With Two-- Phase Power Supply" Abstracts of the 17th Conference on Solid State Devices, Tokyo, 1985, pp. 123–126.

Primary Examiner—William M. Shoop, Jr.
Assistant Examiner—Brian K. Young
Attorney, Agent, or Firm—R. P. Lenart

[57] ABSTRACT

This is a superconducting analog-to-digital converter for producing a digital output signal which is a function of an analog input signal. The analog-to-digital converter uses a nonhysteresis-shunted Josephson junction, an input superconducting inductor, and an output Josephson junction, connected in superconducting loop relationship. A flux proportional to an analog input signal is coupled into the input inductor and a constant bias current source connected such that the current divides between the nonhysteresis-shunted Josephson junction and the output Josephson junction with the bias current source providing a current of at least about the sum of the critical currents of said Josephson junctions to provide voltage pulses across the nonhysteresis-shunted Josephson junction even with a constant level of flux. A Josephson junction integrating counter circuit is connected to sense the ac portion of voltage across the output Josephson junction and the Josephson junction integrating counter circuit is gated. The number of oscillations in the voltage across the output Josephson junction in a predetermined period of time is a function of the analog input signal and the count of the Josephson junction integrating counter circuit during the predetermined period provides a digital output which is a function of to the input signal.

6 Claims, 6 Drawing Sheets

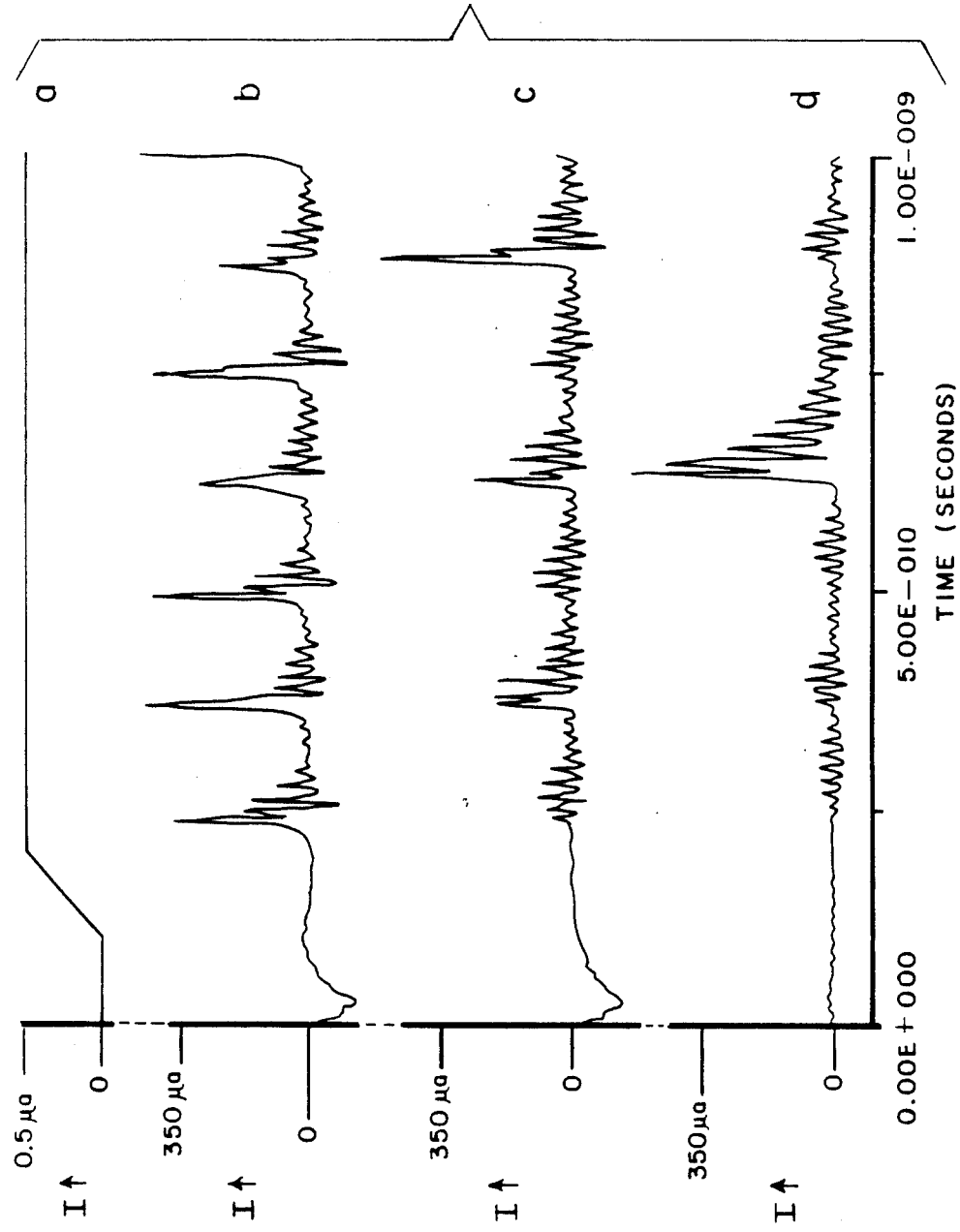

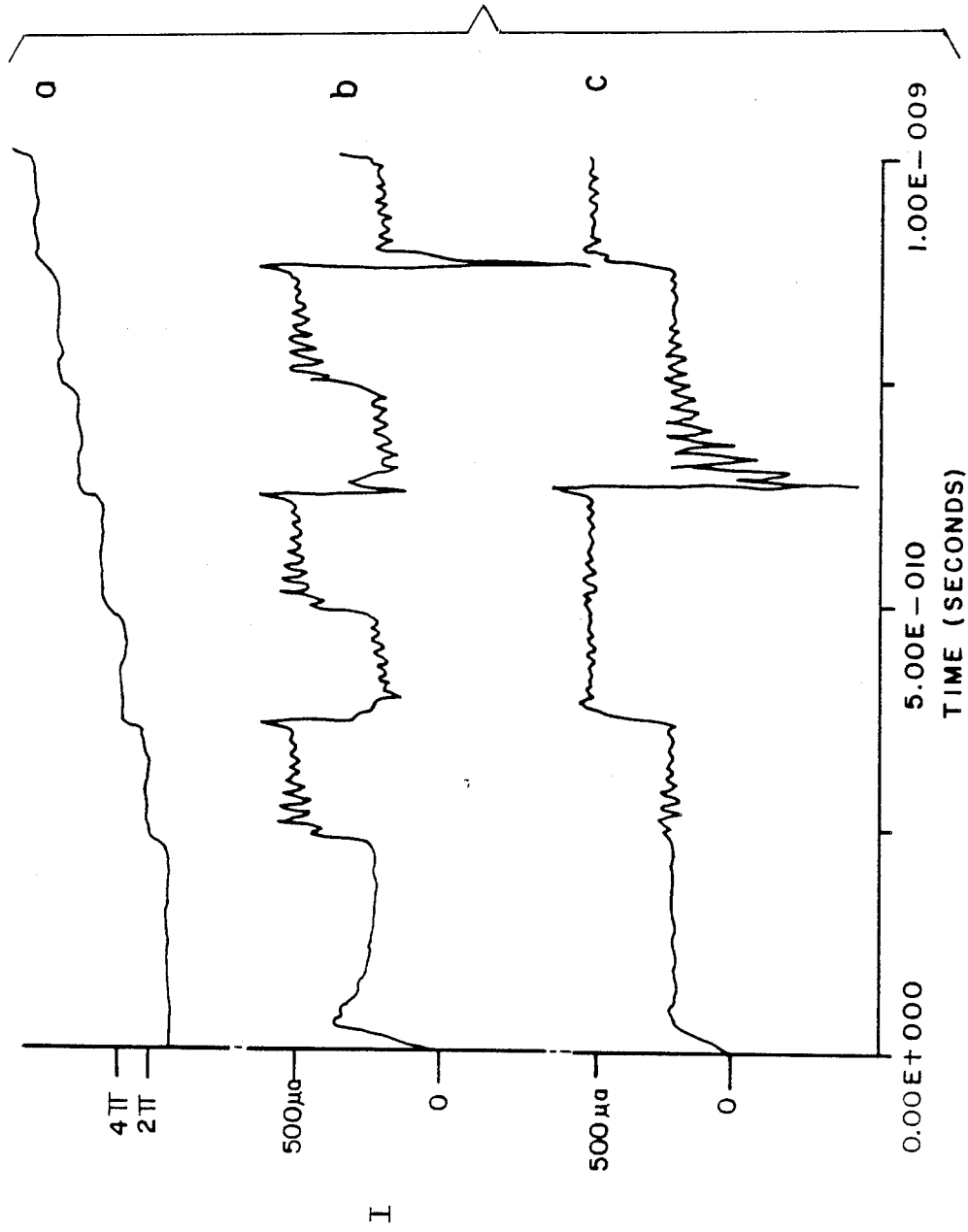

JOSEPHSON ANALOG TO DIGITAL CONVERTER FOR LOW-LEVEL SIGNALS

CROSS-REFERENCE TO RELATED APPLICATION

A superconducting Josephson junction and a method for making such a Josephson junction is described in U.S. Pat. No. 4,768,069, issued Aug. 30, 1988, and assigned to one of the assignees herein. That related application utilizes a layer of niobium nitride on a substrate, an epitaxial layer of a pseudo-binary compound on the layer of niobium nitride, where the pseudo-binary compound has the composition about 3 atomic percent magnesium oxide—about 97 atomic percent calcium oxide, to about 97 atomic percent magnesium oxide—about 3 atom percent calcium oxide, and an epitaxial layer of niobium nitride on the layer of pseudo-binary compound.

A superconducting digital logic amplifier for interfacing superconductor circuits with semiconductor circuits is shown in U.S. Pat. No. 4,859,879, issued Aug. 22, 1989, and assigned to one of the assignees herein. That amplifier provides a gigahertz amplifier to convert low voltage superconducting logic signals to higher voltage signals, suitable for semiconductor signal processing circuits (for example, providing a factor of ten voltage gain to raise the 2.5 mV Josephson logic signals of conventional metallic superconductor circuitry to 25 mV signals for input into inexpensive semiconductor amplifiers which, in turn, can power semiconductor logic circuitry). Generally, it utilizes a first series string of Josephson junctions in series with an input Josephson junction to provide a series combination which is then connected in parallel with a second string of higher critical current Josephson junctions. Current from Josephson junction logic circuitry is introduced through the input Josephson junction, exceeding its critical current and switching it to the resistive state, the combined input and current from a DC current source, then switch the Josephson junctions in the first and then the second series to the resistive state, giving an output voltage of the sum of all of the voltages across the Josephson junctions in the series strings.

A superconducting infrared (IR) detector circuit is described by Bluzer in a related application "Superconducting Infeared Detector", Ser. No. 373,075 filed concurrently herewith, and assigned to one of the assignees herein. In that copending application, the photogenerated current is used as the output signal instead of using a voltage signal. The ac portion of the photogenerated signal current is sent out through a transformer, configured to cancel the dc bias current (and associated noise) and to double the photogenerated ac signal current. A flowing bias current, twice the high temperature superconductor critical current, is divided approximately equally between the high temperature superconductor element and the shunting resistor. Both currents flow through different and opposite primary transformer windings to provide flux cancellation in the secondary winding. Correspondingly, the effect of any change in the current partition between the high temperature superconductor and the shunting resistor elements is doubled in the secondary winding. If a 100 to 1 turn ratio is employed, for example the current change will be increased 200 times. That copending application is especially adaptable for use with the instant invention, and is hereby incorporated by reference herein.

BACKGROUND OF THE INVENTION

1. Field of the Invention

This invention relates to a Josephson junction circuit. In particular, it relates to superconducting analog-to-digital circuitry for extremely low level signals.

2. Description of the Related Art

Josephson junctions are, of course, well known in the art. U.S. Pat. Nos. 4,432,134 issued Feb. 21, 1984, to Jones et al.; 4,242,419 issued Dec. 30, 1980, to Dayem et al.; 4,202,959 issued Sept. 2, 1980, to and, 3,816,845 issued June 11, 1974, to Cuomo et al., give examples of Josephson junction configurations and processes for making them.

Circuitry using Josephson junctions for analog-to-digital conversion is shown in U.S. Pat. No.4,646,060 issued 2/24/87 to Phillips et al, U.S. Pat. No. 4,315,255 issued 2/9/82 to Harris and Hamilton, and U.S. Pat. No. 4,672,359 issued 6/9/87 to Silver. Harris and Hamilton teaches the use of mutual inductances in 1:2:4:8:16:32 ratio feeding parallel superconducting interferometers in their conversion. Both Phillips et al and Silver are level tracking circuits which use a balanced dc quantitizer SQUID (superconducting quantum interference device) with a small bias current (less than 90 percent of the sum of the critical currents) to the pair of Josephson junctions to operate the SQUID in a bi-stable mode, with a quantum change in input flux giving a voltage output pulse. Silver feeds his SQUID with a composite signal including the analog signal, a high frequency dither signal, and a correction signal which maintains the SQUID at a constant operating point. Phillips et al note that in their circuit, positive incremental changes in the analog signal result in the generation of voltage pulses across a first Josephson junction, and negative incremental changes in the analog signal result in the generation of voltage pulses of the same polarity across a second Josephson junction, and that means is included for counting algebraically the voltage pulses across the first and second junctions to determine the corresponding digital value of the changes in the analog signal circuit.

The operating parameters of DC SQUID's and a SQUID amplifier are described in U.S. Pat. No. 4,496,854 issued to Chi et al on 1/29/85. Also described are the details of shunting junctions to make them non-hysteretic, and the high frequency oscillations in junction voltage caused by junction currents greater than the critical current of the junction.

The DC SQUID is described in some detail in an article in the IEEE Trans. on Magnetics, Vol MAG-17, No. 1, January 1981, pp 387-94, by Ketchen. In a paper entitled "A Josephson Counter-Circuit with Two-Phase Power Supply" by Nakagawa et al. (Abstracts of the 17th Conference on Solid State Devices and Materials, Tokyo, 1985, pp. 123-126), a Josephson digital circuit is described which utilizes Josephson junctions to provide a data-latch function for a counter-circuit. A paper entitled "100 GHz Binary Counter Based on DC SQUID", by Hamilton and Lloyd, IEEE Electron Device Letters, Vol. EDL-3, No. 11, pp 335-38, November 1982, describes the Josephson junction integrating counter circuit. The Hamilton et al circuit is the preferred counter for use in the instant invention.

SUMMARY OF THE INVENTION

This is a superconducting analog-to-digital converter for producing a digital output signal which is a function of an analog input signal using a SQUID as a combination amplifier and oscillator. The analog-to-digital converter comprises; a comprises; nonhysteresis-shunted Josephson junction, an input superconducting inductor, and an output Josephson junction connected in a superconducting loop relationship; means for coupling flux proportional to the analog input signal into the input inductor; a constant bias current source connected in a manner that the nonhysteresis-shunted Josephson junction and the output Josephson junction are in parallel with respect to the current source (with the bias current source providing a current of about the sum of the critical currents of the two Josephson junctions to operate the SQUID in an oscillating resistive mode, rather than a bistable superconducting mode, and thus the SQUID senses the level of input, rather than a change in input); a Josephson junction integrating counter circuit connected to sense the ac portion of voltage across the output Josephson junction; and means for gating the Josephson junction integrating counter circuit. The number of oscillations in the voltage across the output Josephson junction in a predetermined period of time is a function of the analog input signal, and the count of the Josephson junction integrating counter circuit during the predetermined period provides a digital output which is a function of the input signal.

Preferably, the nonhysteresis-shunted Josephson junction and the output Josephson junction are matched Josephson junctions, and the output Josephson junction is not nonhysteresis-shunted (a damping resistor is, however, preferably connected across the output Josephson junction). The nonhysteresis-shunting may be provided by a shunt having a resistance of about 10 micro-ohms, and the damping resistor connected across the output Josephson junction may have a resistance of about 3.5 ohms.

BRIEF DESCRIPTION OF THE DRAWINGS

This invention can be best understood by reference to the following drawings in which:

FIG. 3 shows graphs of simulated performance showing the input current and the output currents of each stage;

FIG. 4 shows graphs of simulated performance showing the phase of the output junction in the SQUID amplifier and the currents in the output junctions in each of the two digital flip-flop stages.

DESCRIPTION OF THE PREFERRED EMBODIMENTS

Figure 1:
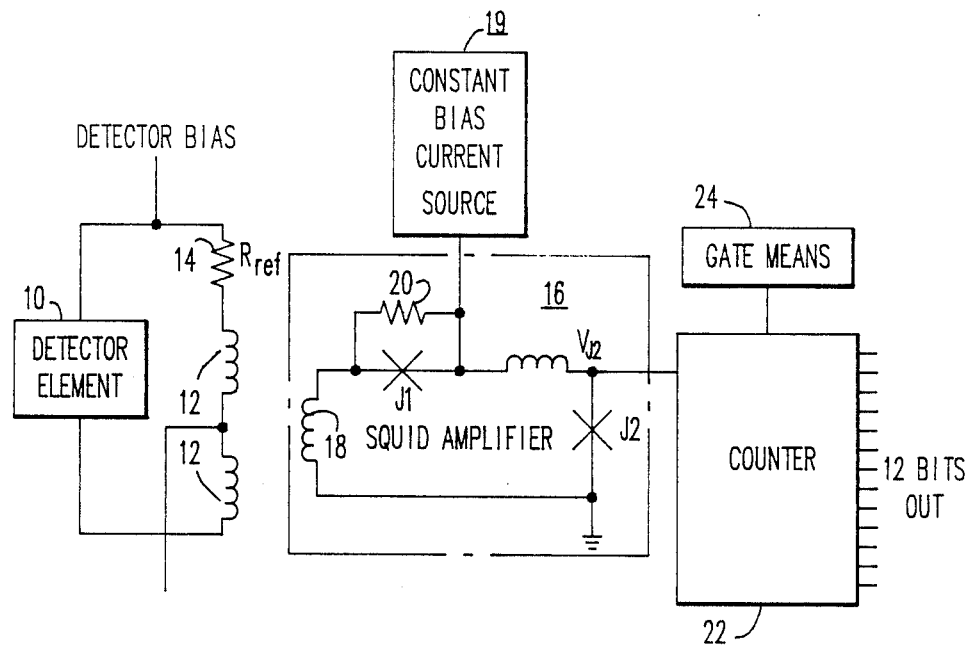
FIG. 1 shows a diagram of an embodiment using the superconducting analog-to-digital converter with an infrared detector.

Recent advances in superconductivity may lead to widespread use of superconductor circuits in high-speed, very low level signal processing. The picosecond switching speed of Josephson junctions can be applied in an analog-to-digital converter capable of operation at X-band frequencies. High-speed shift registers are under development, which could be used to store the output of such an A/D convertor. A 10 GHz shift register can also be used to multiplex or demultiplex a fast data stream. While most development has been in the traditional metallic superconductors which operate at liquid helium temperature (4° Kelvin), this technology will also generally be applicable to the new high temperature ceramic superconductors.

The invention is a superconductive electronic circuit that provides analog-to-digital conversion for picoamp signals. Because of its low power consumption, the circuit can be used on a focal plane of infrared sensors. Increased sensitivity is obtained through the use of a SQUID input stage, instead of the usual single Josephson junction input pulser.

This invention can be used, for example, in the fabrication of a very small, extremely sensitive, superconductive infrared sensor element that is suitable for use, for example, in a focal plane array. Granular films of the high $T_c$ superconductor yttrium-barium-copper oxide can be used as the detector elements. The photoresponse signal can then be amplified and digitized in the novel superconductive electronic circuit that is the subject of this invention. The photoresponse of the high temperature superconductor films apparently derives from the granular nature of the films. Islands of superconductivity in the grains are apparently connected by weak links between the grains. The films are biased near the critical current of the weak links. Incoming photons break Cooper pairs. This diminishes the strength of the weak links, so that the applied current drives them into the voltage state. High temperature superconductor IR detectors require about 1mA of dc bias current to operate. Typically, the output signal is a small dc voltage signal on a large (100 mV) dc voltage. Clearly, this voltage level (100 mV dc) is incompatible with conventional JJ circuits. The output signal from the detector circuit can be transformer coupled to a SQUID amplifier of the instant invention. With proper detector bias current, the signal which is transformer coupled into the SQUID amplifier is primarily due to the photocurrent only. This detector arrangement can produce a current signal corresponding to 320 pA. The SQUID amplifier has an equivalent sensitivity of 1 pA using a $10^{12}$ photon/$cm^2$-sec signal with a $(100 \ \mu m)^2$ detector and a 1msec integration time. The resolution of this arrangement is about 300 photons.

Superconductive electronics provides the lowest noise amplifiers at frequencies below 100 MHz, i.e., the Superconductive Quantum Interference Device (SQUID). The circuit designed to sense and digitize 150 pA photo-response signals to an accuracy of 1 pA in a measurement time of 1 msec. Furthermore, the power dissipation of the circuit is less than 100 $\mu W$, which makes it possible to digitize on the focal plane, something that cannot be done with semiconductor technology.

SQUIDs can be made with an input sensitivity of $10^{-6} \phi_o/\sqrt{Hz}$, where $\phi_o$ is a flux quantum and Hz is the frame rate. With a 1 kHz frame rate, about $3 \times 10^{-5} \phi_o$ equivalent input noise level can be obtained. This means that over one lobe of a SQUID response curve (one $\phi_o$) the SQUID could distinguish about 30,000 different signal levels. Furthermore, the required sensitivity to input signal levels has already been demonstrated (SQUID amplifiers have been fabricated in NbN and input sensitivities of less than 1 pA have been measured).

A single Josephson Junction (JJ) oscillates at a frequency which is directly proportional to the average junction voltage over the gate time. An A/D converter with an extremely accurate averaging response can thus be made by using the input signal to modulate the junction voltage and then counting the resulting oscillations. While the low voltage region of a tunnel junction I-V curve is hysteretic and unstable, this is circumvented by using a low impedance shunt to suppress the hysteresis and linearize the I-V curve.

The simplest possibility for using the input signal from a detector to modulate junction voltage would be to apply an input current directly to a single shunted junction, however, because of the low impedance shunt, this approach has a sensitivity of only about 2 $\mu$A for the least sensitive bit (which is about six orders of magnitude short of the desired performance).

The desired gain in sensitivity is achieved by inserting a SQUID amplifier before the A/D input. FIG. 1 illustrates this approach. The detector bias current is split between the detector and a matched reference resistor. The two currents are recombined through the input coil of the SQUID. Thus, to a first approximation, noise on the detector bias current cancels while changes in detector current cause an imbalance which adds at the SQUID input. Since the detector output is transformer coupled, many detectors can be biased in series from a common current source. This input bridge circuit is the subject of the aforementioned copending application by Bluzer.

The SQUID is biased so that its output voltage is a function of the flux coupled into the SQUID. SQUIDs of this type have been investigated and sensitivities of $10^{-6}$ $\phi_o/\sqrt{Hz}$ have been achieved. In a 1 kHz bandwidth the sensitivity will be $3 \times 10^{-5}$ $\phi_o$. Thus a dynamic range of 7000 (or more than enough to provide for 12 bits) can be achieved within a range of flux of $\phi_o/4$. Over this range the SQUID response is nearly linear.

In the customary approach, a symmetrical SQUID output would be fed to the input of a Josephson A/D converter. In contrast, with the novel circuit, junction J2 of the asymmetrically shunted SQUID is itself an oscillator (as well as an amplifier) which can directly drive the counter. The gain of the SQUID ($V_{out}/V_{in}$) is controlled by the input inductance L. An input sensitivity of 1 pA and 12 bit resolution implies an input inductance:

$$L = \phi_o/(1\ pA \times 2^{12}) = 0.5\ \mu H.$$

Figure 2A:
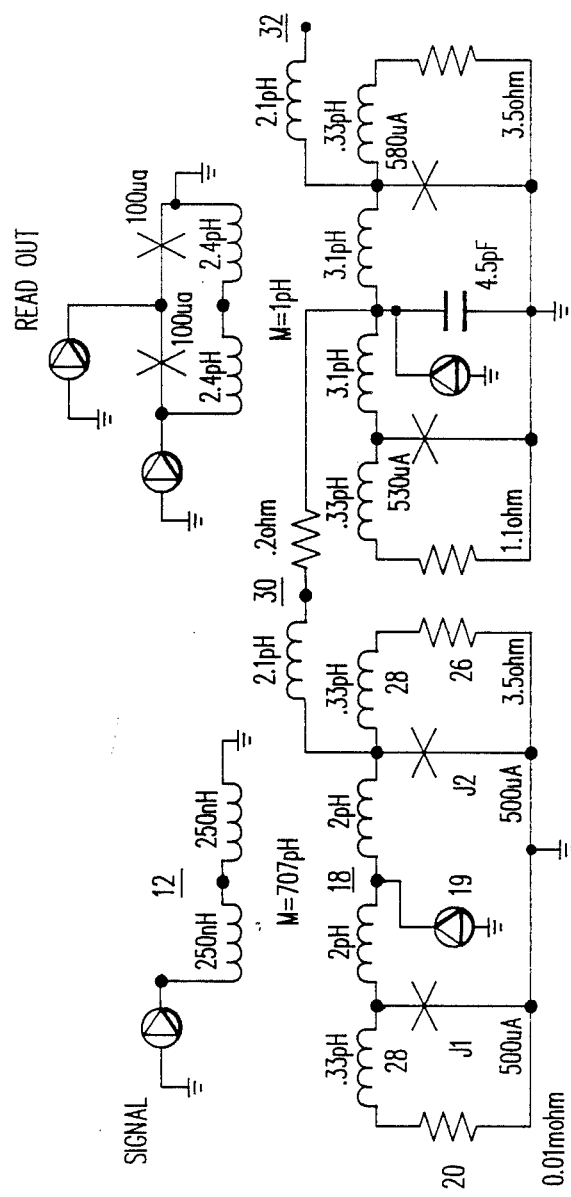
FIG. 2A and FIG. 2B are schematic diagrams showing an alternate configuration of the superconducting analog-to-digital converter, with the SQUID amplifier followed by a 2-bit counter.

By placing the nonhysteresis-shunt resistance 20 across only J1 (as shown in FIG. 2A) the SQUID inductance causes J2 to oscillate with narrow, easily-counted pulses. A relatively high resistance 26 (as opposed to the very low resistance nonhysteresis-shunt across J1) damping resistor can be used across J2. Thus the shunt across nonhysteresis-shunted Josephson junction J1 generally has a resistance of about 10 micro-ohms, while the damping resistor connected across the output Josephson junction J2 may have a resistance of about 3 ohms. This provides a DC SQUID which is asymmetrical in resistance.

The pulse repetition frequency is given by the Josephson voltage-frequency relation:

$$f = 2\ eV_{J2}/h = 483\ MHz/\mu V$$

The pulses are counted over a gate time interval T resulting in a final count given by:

$$N = \frac{2e}{h}\ V_{J2}(t)\ dt$$

Thus in FIG. 1, for a given level of infrared reaching the detector element 10, there is a corresponding current flowing through the detector element 10 and the lower portion of the detector output inductor 12. As the detector bias current is constant, the current through the reference resistor 14 will be equal to the detector bias current minus the detector element current. The detector element current and the current through the reference resistor flow in opposite directions in the detector output inductor 12 and a flux proportional to the difference between the two currents will be coupled to the SQUID amplifier-oscillator 16. Changes in infrared level cause changes in detector current which in turn cause the two currents to change in opposite directions, so that the changes add at the SQUID input (giving gain of a factor of two).

Flux coupled from the detector output inductor 12 into the SQUID input inductor 18 causes a signal current (proportional to the flux) to flow in the SQUID amplifier loop (as J1 and J2 are dc current biased at about their critical current by constant bias current source 19), the magnitude of the signal current at any point in time offsets the bias current so that, for example, more flows through J1, and less through J2. The offsetting of the bias current changes the frequency at which the SQUID amplifier loop oscillates (and the average voltage across J2) as a function of the signal current (and thus a function of the flux coupled from the detector output inductor 12). The shunt 20 eliminates the hysteresis of J1, while J2 does not have a low resistance shunt (J2 may, however, be paralleled by a high resistance damping resistor) and thus the voltage pulses across J2 are relatively high and thus can be used to drive the integrating counter 22. The calculation of the maximum shunt resistance which will provide nonhysteretic conditions is well known and is described, for example, in the aforementioned U.S. Pat. No. 4,496,854 to Chi et al. The gate means 24 provides gates so that the integrating counter 22 counts the oscillations for a predetermined period of time. The number of counts at the end of a period is a function of the level of the flux in the SQUID amplifier loop during the period of time.

Thus a constant level of infrared on the detector element 10 would give a constant flux, a constant offset, and a constant frequency of oscillation, and, during time periods of the same length, a constant number of counts on the integrating counter 22. A shift in level of infrared would then shift the flux, the offset, frequency of oscillation, and give a different number of counts in a like time period.

Figure 2B:
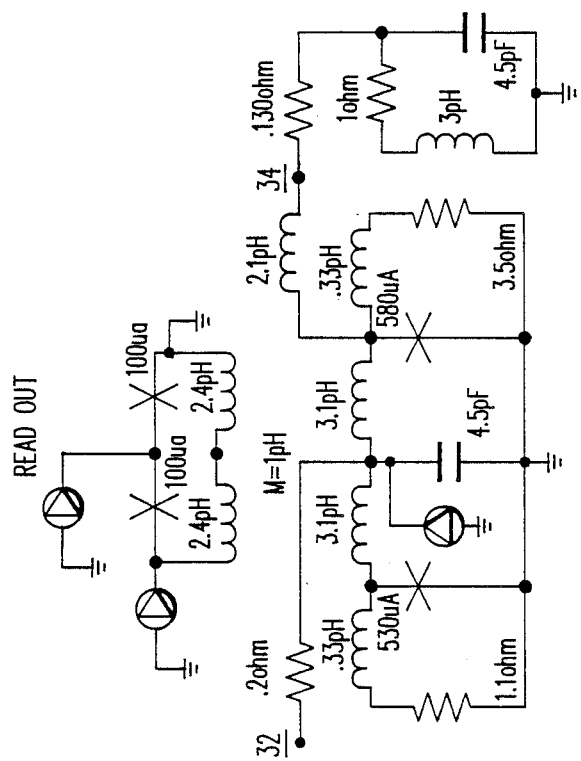

FIGS. 2A and 2B show a slightly different SQUID amplifier-oscillator configuration with the SQUID bias current introduced into a center tap of SQUID input inductor 18. FIGS. 2A and 2B also show typical values of components (thus J1 and J2 have critical currents of 500 microamps and a 3.5 ohm damping resistor 26 is across J2 in the FIG. 2A configuration). Inductors 28 have been added in series with the shunt and damping resistor to provide further damping. The Hamilton et al.

circuit in the aforementioned paper entitled "100 GHz Binary Counter Based on DC SQUID", is the preferred counter for use in the instant invention and the 2-bit counter shown is an example of a portion of such a counter and operates as described therein. The circuit schematic of FIGS. 2A and 2B is simplified and shows only two counter stages, but can be extended to any number of bits, simply by adding more flip-flop counter stages. Each additional counter increases the bit output by one.

For the purpose of saving computation time on the computer in preparing FIG. 3, the shunt resistor 20 on the non-hysteretic junction in the input SQUID amplifier was assigned the value 0.05 ohm. This increased the count rate. In general, this resistor should have a value small enough to ensure that the total pulses during a counting interval will not overflow the counter. For the simulation, a dummy load was connected to the last stage, to simulate a much longer counter. FIG. 3(a) shows the input signal rising from 0 to 0.5 microamp between 100 and 200 microsecond. In response, the SQUID amplifier produced six full current pulses and one partial pulse between 200 and 1,000 picoseconds through node 30 with a waveform as shown in FIG. 3(b). The first digital flip-flop produced three output pulses through node 32 as shown in FIG. 3(c), i.e., the desired divide-by-two operation was obtained. The second digital flip-flop, produced a single output pulse through node 34 as shown in FIG. 3(d), as desired, in response to the second pulse from the first flip-flop.

FIG. 4 shows the binary counting of phase jumps in the SQUID output junction. The top trace 4(a) is the phase of the SQUID output junction J2. It jumps from 0 to $2\pi$ (360°) to $4\pi$ etc. The middle trace 4(b) shows the current through the output junction J4 of the least significant bit in the counter. Low values correspond to binary "0", high values are binary "1". The least significant bit makes a transition from "0" to "1" with each phase jump. The second bit, shown in the bottom trace 4(c) of current through J6, makes the transition at every other phase jump. This demonstrates proper binary counting.

Figure 5:
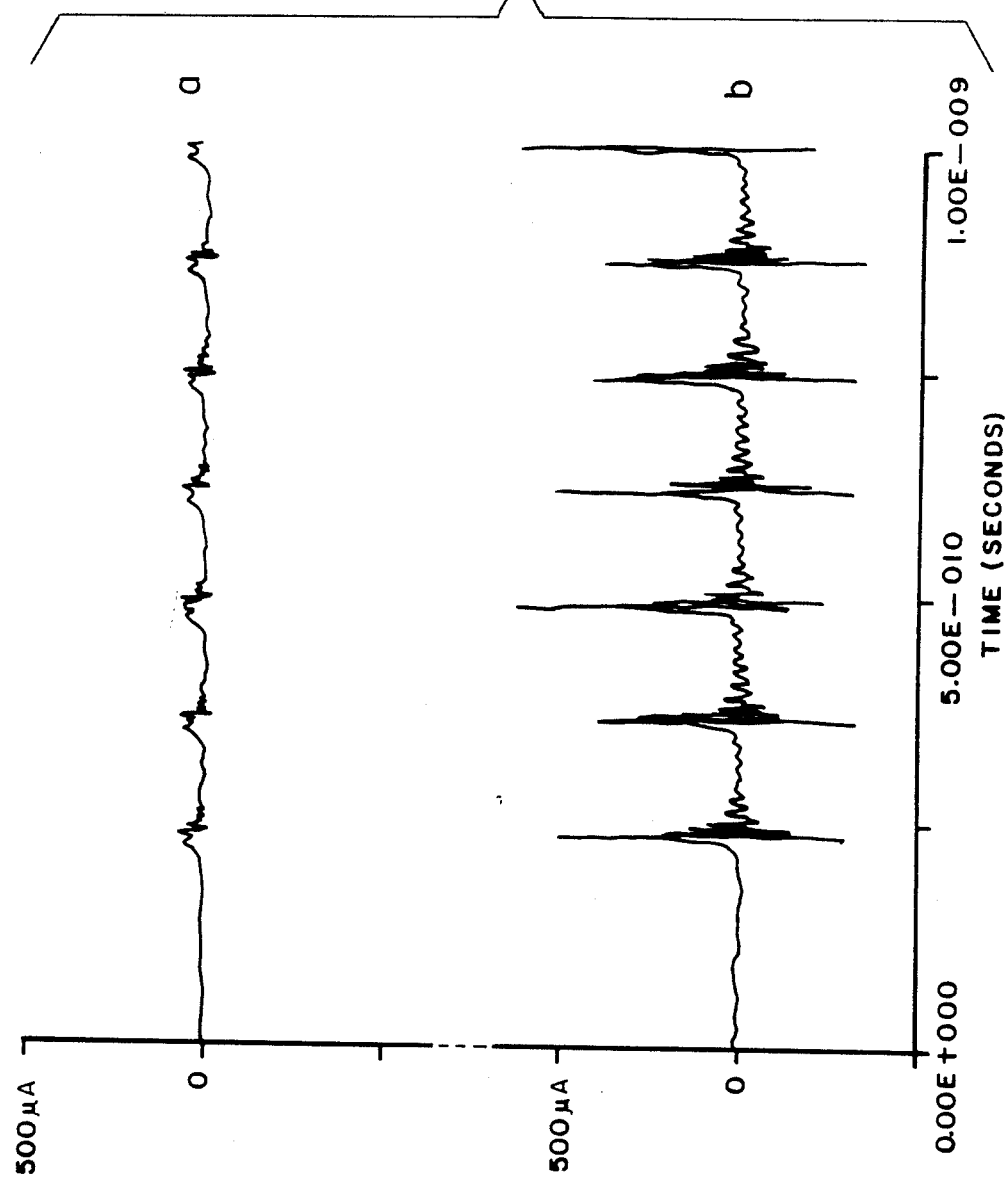
FIG. 5 graphs of simulated performance the voltage pulses versus time in the SQUID amplifier-oscillator across the non-hysteretically shunted junction and across the output junction.

FIG. 5 illustrates the relative amplitude and sharpness of the voltage pulses across the junctions in the SQUID amplifier. The top trace, FIG. 5(a), shows the pulses across J1, when it is shunted by a 0.05 ohm resistor. The bottom trace, FIG. 5(b), shows the pulses across J2, when it is shunted by a 3.5 ohm resistor. Lower values of resistance diminish the height and broaden the pulses of the corresponding junction. The pulse counter circuit works best when it is counting sharp pulses of high amplitude.

Both high and low value resistors contribute to proper operation of the circuit. The low value shunt resistor 20 dominates the parallel conductance of the two resistors. Thus, it establishes the voltage range for the SQUID amplifier, and consequently, the pulse rate. The high value damping resistor 26 gives minimal damping of the pulse of the output junction, to provide sharp pulses to the counter circuit.

In summary, this circuit has a front end which is a novel, asymmetrical in resistance, SQUID amplifier-oscillator and a back end which is a Josephson flip-flop counter. The combination of the two is an analog-to-digital converter that is sensitive to very low-level input signals. This novel circuit can be used, for example, to build a superconductive infrared focal plane array.

The invention is not to be construed as limited to the particular examples described herein, as these are to be regarded as illustrative, rather than restrictive. The invention is intended to cover all devices which do not depart from the spirit and scope of the invention.

We claim:

1. A superconducting analog-to-digital converter for producing a digital output signal which is a function of an analog input signal, said analog-to-digital converter comprising:
   a. a nonhysteresis-shunted Josephson junction, an input superconducting inductor, and an output Josephson junction, connected in superconducting loop relationship;
   b. means for coupling flux proportional to said analog input signal into said input inductor;
   c. a constant bias current source connected in a manner that said nonhysteresis-shunted Josephson junction and said output Josephson junction are in parallel with respect to said current source, said bias current source providing a current having a magnitude equal to about the sum of the saturation current of said Josephson junctions;
   d. a Josephson junction integrating counter circuit connected to sense the ac portion of voltage across said output Josephson junction; and
   e. means for gating said Josephson junction integrating counter circuit, whereby the number of oscillations in the voltage across the output Josephson junction in a predetermined period of time is a function of the analog input signal and the count of the Josephson junction integrating counter circuit during the predetermined period provides a digital output which is a function of the input signal.

2. The converter of claim 1, wherein said nonhysteresis-shunted Josephson junction and said output Josephson junction are matched Josephson junctions.

3. The converter of claim 2, wherein said output Josephson junction is not nonhysteresis-shunted.

4. The converter of claim 1, wherein a damping resistor is connected across said output Josephson junction, said damping resistor having a resistance at least three orders of magnitude greater than the value of the shunt across said nonhysteresis-shunted Josephson junction.

5. The converter of claim wherein said nonhysteresis-shunting is provided by a shunt having a resistance of about 10 micro-ohms.

6. The converter of claim 4, wherein said damping resistor connected across said output Josephson junction has a resistance of about 3.5 ohms.

* * * * *